United States Patent
Astorga et al.

(10) Patent No.: US 12,418,096 B2
(45) Date of Patent: Sep. 16, 2025

(54) ANTENNA ARRAY ARCHITECTURE WITH ELECTRICALLY CONDUCTIVE COLUMNS BETWEEN SUBSTRATES

(71) Applicant: VIASAT, INC., Carlsbad, CA (US)

(72) Inventors: Luis G. Astorga, Chandler, AZ (US); Steven J. Franson, Scottsdale, AZ (US)

(73) Assignee: VIASAT, INC., Carlsbad, CA (US)

( * ) Notice: Subject to any disclaimer, the term of this patent is extended or adjusted under 35 U.S.C. 154(b) by 371 days.

(21) Appl. No.: 18/245,042

(22) PCT Filed: Sep. 14, 2020

(86) PCT No.: PCT/US2020/050681
§ 371 (c)(1),
(2) Date: Mar. 13, 2023

(87) PCT Pub. No.: WO2022/055507
PCT Pub. Date: Mar. 17, 2022

(65) Prior Publication Data
US 2023/0395967 A1    Dec. 7, 2023

(51) Int. Cl.
*H01Q 1/22*   (2006.01)
*H01L 23/00*  (2006.01)
(Continued)

(52) U.S. Cl.
CPC ........... *H01Q 1/2283* (2013.01); *H01L 24/13* (2013.01); *H01L 24/16* (2013.01); *H01Q 1/48* (2013.01);
(Continued)

(58) Field of Classification Search
CPC ............. H01Q 1/2283; H01Q 21/0025; H01Q 21/065; H01Q 23/00; H01L 23/66; H01L 2223/6677
See application file for complete search history.

(56) References Cited

U.S. PATENT DOCUMENTS 10,985,451 B2 * 4/2021 Kim ................ H01L 21/4857
11,189,905 B2 * 11/2021 Gu ................. H01L 23/5389
(Continued)

FOREIGN PATENT DOCUMENTS

JP   2007-287776 A2   11/2007
JP   2009-021510 A2   1/2009
(Continued)

OTHER PUBLICATIONS

"A Reliable Interconnection Solution for Absorbing Large CTE Mismatches", found on the Internet at: https://www.globalsmt.net/articles-and-papers/a-reliable-interconnection-solution-for-absorbing-large-cte-mismatches/, 11 pages.

(Continued)

*Primary Examiner* — Hasan Islam
(74) *Attorney, Agent, or Firm* — F. CHAU & ASSOCIATES, LLC

(57) ABSTRACT

An antenna apparatus includes an antenna substrate with opposite first and second surfaces; and a PCB having opposite first and second surfaces. Antenna elements are disposed at the first surface of the antenna substrate. Electrically conductive columns, each having a first end attached to the second surface of the PCB and a second end attached to the second surface of the antenna substrate, secure the PCB to the antenna substrate and provide an electrical interconnect between the PCB and the antenna substrate. RFIC chips are each attached to the second surface of the antenna substrate and are coupled to the antenna elements. At least one circuit element is attached to the first surface of the PCB and electrically coupled to at least one of the RFIC chips through at least one of the electrically conductive columns.

24 Claims, 13 Drawing Sheets

(51) Int. Cl.
    *H01Q 1/48*          (2006.01)
    *H01Q 3/36*          (2006.01)
    *H01R 12/52*         (2011.01)
    *H05K 1/14*          (2006.01)
    *H05K 1/18*          (2006.01)

(52) U.S. Cl.
    CPC .............. *H01Q 3/36* (2013.01); *H01R 12/52* (2013.01); *H05K 1/144* (2013.01); *H05K 1/181* (2013.01); *H01L 2224/13147* (2013.01); *H01L 2224/16227* (2013.01); *H05K 2201/10242* (2013.01); *H05K 2201/10265* (2013.01)

(56) References Cited

U.S. PATENT DOCUMENTS

| | | |
|---|---|---|
| 2011/0003450 A1 | 1/2011 | Lee et al. |
| 2011/0036620 A1 | 2/2011 | Lin |
| 2013/0002487 A1 | 1/2013 | Hosoya et al. |
| 2015/0015453 A1 | 1/2015 | Puzella et al. |
| 2016/0306034 A1 | 10/2016 | Trotta et al. |
| 2019/0067221 A1 | 2/2019 | Lasiter et al. |
| 2019/0260109 A1 | 8/2019 | Gu et al. |
| 2019/0288382 A1 | 9/2019 | Kamgaing et al. |

FOREIGN PATENT DOCUMENTS

| | | |
|---|---|---|
| JP | 2011-040720 A2 | 2/2011 |
| JP | 2011258835 A2 | 12/2011 |
| JP | 2012-231386 A2 | 11/2012 |
| JP | 2020-125927 A2 | 8/2020 |
| WO | 2011114412 A1 | 9/2011 |

OTHER PUBLICATIONS

International Search Report dated May 23, 2021 in corresponding PCT Appln. Serial No. PCT/US2020/050681 (16 pages).

\* cited by examiner

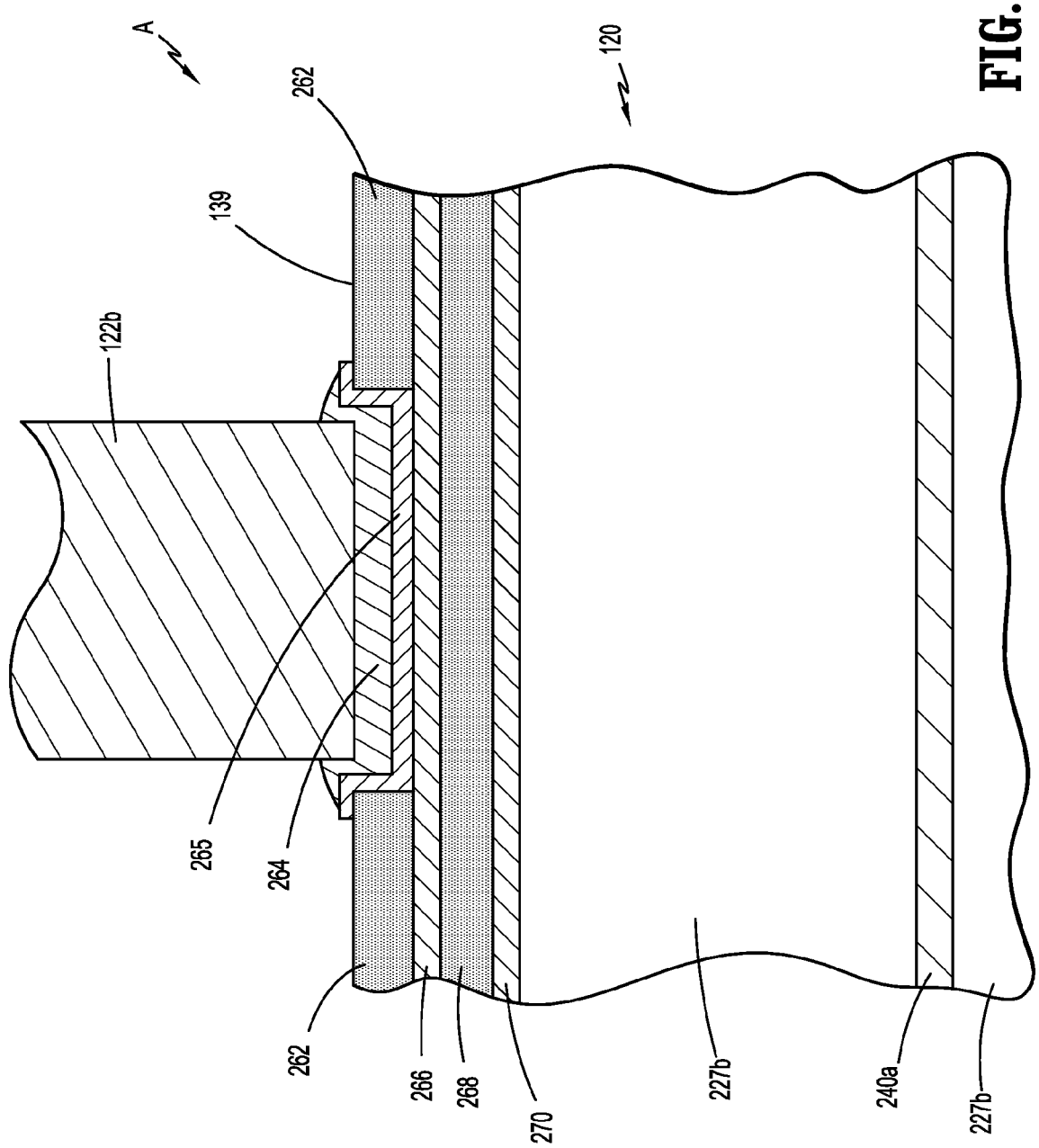

ANTENNA ARRAY ARCHITECTURE WITH ELECTRICALLY CONDUCTIVE COLUMNS BETWEEN SUBSTRATES

CROSS REFERENCE TO RELATED APPLICATION

The present Application is a 371 National Stage entry of PCT application no. PCT/US2020/050681, filed Sep. 14, 2020, the entirety of which is incorporated herein by reference.

TECHNICAL FIELD

This disclosure relates generally to compact architectures for antenna arrays integrated with radio frequency integrated circuit chips (RFICs).

DISCUSSION OF RELATED ART

Antenna arrays are deployed for a variety of applications at microwave and millimeter wave frequencies, e.g., in aircraft, satellites, vehicles, and base stations for general land-based communications. Such antenna arrays typically include microstrip radiating elements driven with phase shifting beamforming circuitry to generate a beam steerable phased array. It is typically desirable for an entire antenna system, including the antenna array and beamforming circuitry, to occupy minimal space with a low profile while meeting requisite performance metrics over a range of environmental conditions.

A low profile antenna array apparatus may be constructed with antenna elements integrated with RFICs (e.g. MMICs) in a compact structure. The antenna array apparatus may have a sandwich type configuration in which the antenna elements are disposed in an exterior facing component layer and the RFICs are distributed across the effective antenna aperture within a proximate, parallel component layer behind the antenna element layer. The RFICs may include RF power amplifiers (PAs) for transmit operations, low noise amplifiers (LNAs) for receive operations, and/or phase shifters/amplitude adjusters for beam steering. By distributing PAs/LNAs in this fashion, high efficiency on transmit and/or low noise performance on receive are realizable. Complex connection layouts may bring DC biasing voltages to the amplifiers and control signals for beam steering to the phase shifters. A typical antenna array apparatus for generating a narrow beamwidth of just a few degrees may include hundreds or thousands each of RFIC chips, antenna elements and control lines. Such a complex arrangement presents design challenges to produce a low profile design suitably operational in a wide range of environments.

SUMMARY

In an aspect of the present disclosure, an antenna apparatus includes an antenna substrate with opposite first and second surfaces; and a printed circuit board (PCB) having opposite first and second surfaces. A plurality of antenna elements are disposed at the first surface of the antenna substrate. A plurality of electrically conductive columns, each having a first end attached to the second surface of the PCB and a second end attached to the second surface of the antenna substrate, secure the PCB to the antenna substrate and provide an electrical interconnect between the PCB and the antenna substrate. A plurality of radio frequency integrated circuit (RFIC) chips are each attached to the second surface of the antenna substrate and are coupled to the plurality of antenna elements. At least one circuit element is attached to the first surface of the PCB and electrically coupled to at least one of the RFIC chips through at least one of the electrically conductive columns.

In various examples, the electrical interconnect can be an RF interconnect to communicate an RF signal; a DC interconnect to communicate a DC signal; or a data control signal interconnect to communicate a data control signal. The PCB and the antenna substrate can have different coefficients of thermal expansion (CTEs), and the columns deflect, flex or compress to provide relief of stress due to the different CTEs.

In another aspect, an interconnection structure for an electronic device includes a substrate having an upper surface; a PCB having an upper surface and a lower surface; and a plurality of electrically conductive columns attached between the lower surface of the PCB and the upper surface of the substrate. The columns secure the PCB to the substrate and provide electrical interconnects between the PCB and the substrate. A plurality of IC chips are attached to the upper surface of the substrate. At least one circuit element is attached to at least one of the upper surface and the lower surface of the PCB and is electrically coupled to at least one of the IC chips through at least one of the electrically conductive columns.

BRIEF DESCRIPTION OF THE DRAWINGS

The above and other aspects and features of the disclosed technology will become more apparent from the following detailed description, taken in conjunction with the accompanying drawings in which like reference characters indicate like elements or features. Various elements of the same or similar type may be distinguished by annexing the reference label with an underscore/dash and second label that distinguishes among the same/similar elements (e.g., _1, _2), or directly annexing the reference label with a second label. However, if a given description uses only the first reference label, it is applicable to any one of the same/similar elements having the same first reference label irrespective of the second label. Elements and features may not be drawn to scale in the drawings.

FIG. 3A illustrates an example interconnect structure of the region "A" in FIG. 2, in which an electrically conductive column is conductively adhered to a first metal layer of an antenna substrate.

DETAILED DESCRIPTION OF EMBODIMENTS

The following description, with reference to the accompanying drawings, is provided to assist in a comprehensive understanding of certain exemplary embodiments of the technology disclosed herein for illustrative purposes. The description includes various specific details to assist a person of ordinary skill the art with understanding the technology, but these details are to be regarded as merely illustrative. For the purposes of simplicity and clarity, descriptions of well-known functions and constructions may be omitted when their inclusion may obscure appreciation of the technology by a person of ordinary skill in the art.

Figure 1:
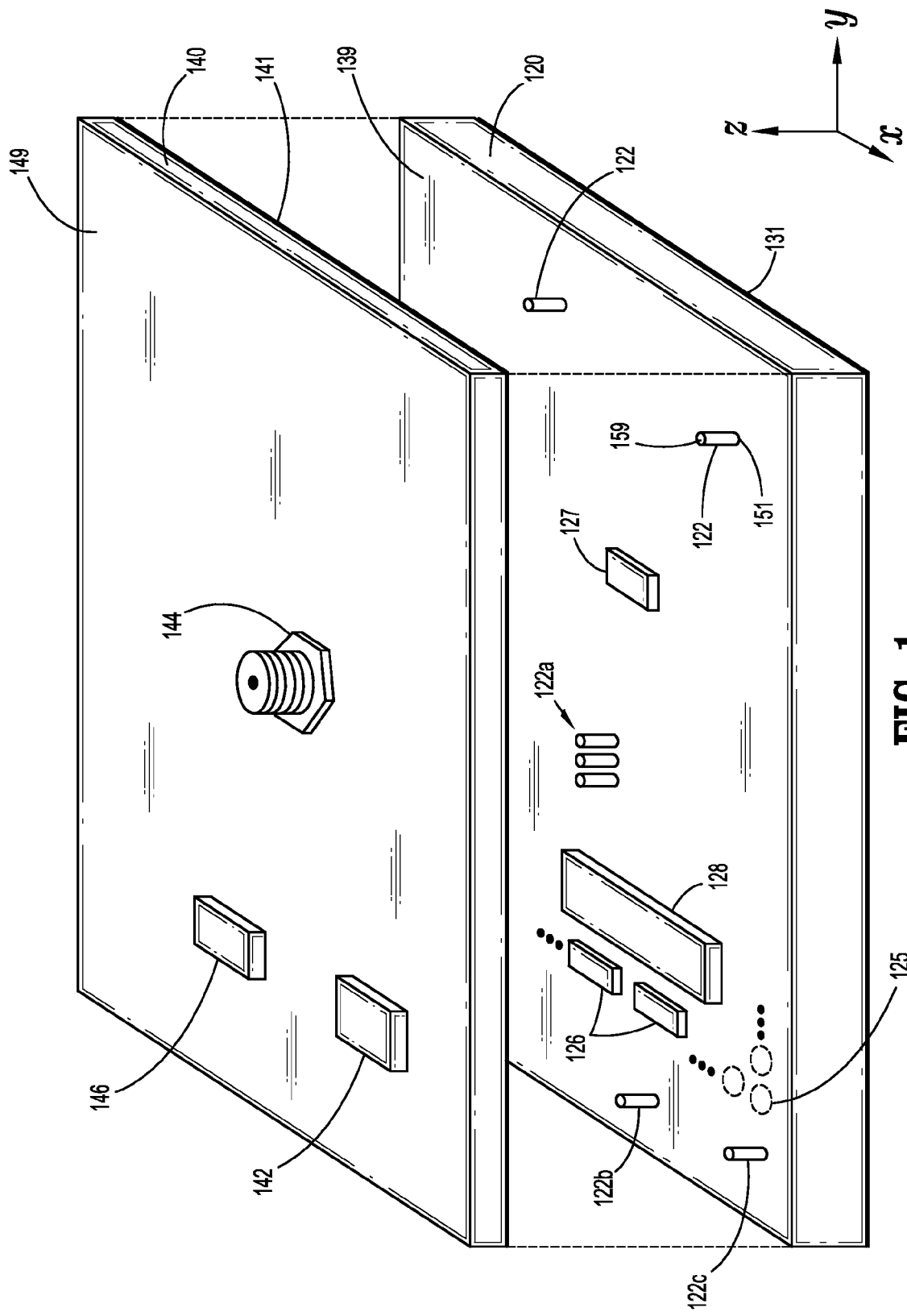
FIG. 1 is an exploded perspective view of an example antenna apparatus according to an embodiment.

FIG. 1 is an exploded perspective view of an example antenna apparatus, 100, according to an embodiment. Antenna apparatus 100 has a compact arrangement that includes a plate-like antenna substrate 120 secured to a printed circuit board (PCB) 140 by a plurality of electrically conductive columns 122. A plurality of antenna elements 125 are disposed at a first major surface 131 (in the x-y plane) of antenna substrate 120. A plurality of radio frequency integrated circuit (RFIC) chips 126 are each attached to a second, opposite major surface 139 of antenna substrate 120 and are coupled to antenna elements 125. At least one circuit element, such as a field programmable gate array (FPGA) 142, a DC connector 146 and/or an RF connector 144, are attached to a first major surface 149 of PCB 140. Each of the columns 122 may provide an electrical interconnect between the circuit element(s) secured to PCB 140 and RFIC chips 126, through conductive layers within antenna substrate 120.

To provide the electrical interconnect, each of columns 122 may have a first end 151 attached to second surface 139 of antenna substrate 120 and a second end 159 attached to a second surface 141 of PCB 140. Antenna substrate 120 and PCB 140 may have different coefficients of thermal expansion (CTEs). The structure and material of columns 122 may be designed to permit stress relief by allowing antenna apparatus 100 (hereafter, "antenna 100" interchangeably) to accommodate CTE mismatch between antenna substrate 120 and PCB 140. To this end, the column 122 configuration allows it to deform by flexing, compressing or stretching as the PCB and antenna substrate expand at different rates over temperature, while maintaining the electrical connection. This contrasts to a solder ball, which may break when subject to the same stress. For instance, columns 122 may each be configured with shapes such as a solid cylinder; a solid cylinder with a spiraling skin of a different material; a spring; a flexible solid structure; or a micro-coaxial cable section. Columns 122 may be composed of solder (e.g. a Pb/Sn alloy) or other conductive material. In one example, columns 122 are column grid array (CGA) type columns with a Pb/Sn alloy interior cylinder and a spiraling wrapped skin made of copper for better heat conduction and reliability. In FIG. 1, only a few columns 122, RFIC chips 126, antenna elements 125, etc. are shown for simplicity of illustration. In a typical embodiment of antenna 100, antenna elements 125, RFIC chips 126 and columns 122 may each number in the hundreds or thousands. Further, a plurality of FGPAs 142, a plurality of DC connectors 146 and/or a plurality of RF connectors 144 may be included in antenna 100 and attached to PCB 140. The entire mechanical support for the attachment of PCB 140 to antenna substrate 120 may be provided by columns 122.

For instance, columns 122 may be formed as solid solder columns by a process that incrementally builds up the columns in layers of solder. An example process may first form a lowest layer of all columns 122 against a solder pad on the second surface 139 of antenna substrate or second surface 141 of PCB 140. The lowest layer may be formed sequentially using a computer controlled solder tool that moves in a sequence from column to column. The process may be repeated layer by layer to incrementally build the height of the columns (in the z plane) until a desired height is reached on all columns 122. The last solder layer may be composed of a lower temperature solder than the solder on the other layers of the columns 122. For instance, if columns 122 are built up from the surface of antenna substrate 120, a final adhering step may involve placing PCB 140 atop the columns 122 by aligning low temperature solder pads on second surface 141 of PCB 140 with the columns 122. Then, the entire antenna assembly may be heated at a temperature sufficient to melt only the low temperature solder to complete the PCB 140 to antenna substrate 120 adhering process.

For example, PCB 140 may have one or more FPGAs 142, DC connectors 146 and RF connectors 144 attached to its first surface 149, and these circuit elements may electrically connect to signal and/or ground lines formed within antenna substrate 120 through columns such as 122*a*, 122*b* and 122*c*. Antenna substrate 120 may have multiple thin metal layers formed therein which may be patterned to form DC bias lines, control signal lines, ground lines, and RF transmission lines. For instance, column 122*b* may be a DC interconnect that couples DC connector 146 to a DC line within antenna substrate 120 to communicate a DC signal. The DC signal may bias amplifiers within RFIC chips 126. Column 122*c* may be a data control signal interconnect that couples FPGA 142 to a control signal line within antenna substrate 120 to communicate a data control signal. The data control signal may be provided to RFIC chip 126 and/or other IC chips such as a serial peripheral interface (SPI) chip 127. SPI chip 127 may generate phase shifter control signals based on the data control signal, which are provided to multiple RFIC chips 126 to adjust phase shifters therein and thereby operate antenna 100 as a phased array. Columns 122*a* may be RF interconnects that couple RF connector 144 to a transmission line to communicate an RF signal.

Antenna 100 may include a beamforming network (BFN) formed partially or entirely on at least one printed circuit board (PCB) section 128 (hereafter exemplified as a plurality of PCB sections 128) coplanarly situated between RFIC chips 126 and attached to second surface 139 of antenna substrate 120. Each PCB section 128 may be composed of a dielectric substrate such as alumina, a signal conductor, and at least one ground conductor, which collectively form a transmission line section, e.g., in coplanar waveguide (CPW) or microstrip. The provision of multiple PCB sections 128 rather than a single PCB section 128 may facilitate manufacturing of antenna 100. The BFN is a combiner/divider network, sometimes called a "corporate network" or a "distribution network", that divides an input RF transmit signal into N divided "element signals" for transmission by N respective antenna elements 125 forming the antenna array, and/or combines N receive path element signals provided by the N antenna elements 125 into a final composite receive signal. RF connector 144 may electrically connect to an input of the BFN (in the transmit case) and/or an output of the BFN (in the receive case). In another embodiment, the PCB sections 128 are omitted and the BFN is instead formed within a layer of antenna substrate 120. Different ways of connecting the BFN to RF connector 144 will be discussed later.

Antenna elements 125 may each be a microstrip patch antenna element printed on antenna substrate 120 to form a planar array. Other types of antenna elements such as dipoles or monopoles may be substituted. Antenna elements 125 may be electrically or electromagnetically coupled to ("fed from") an RFIC chip 126 at a respective feed point. RFIC chips 126 may be mechanically connected to antenna substrate 25 by solder bump connections or the like to connection pads located on antenna substrate 25. RFIC chips 126 may also be mechanically and electrically connected to an antenna ground plane proximately below surface 139 in a "single RF layer substrate" case discussed below. In a typical embodiment, each RFIC chip 126 is coupled to multiple (e.g. several) antenna elements 125, and RFIC chips 126 are distributed across substantially the entire effective aperture of the planar array formed by antenna elements 125.

Antenna elements 125, when embodied as microstrip patches, may have any suitable shape such as circular, square, rectangular, elliptical or variations thereof, and may be fed and configured in a manner sufficient to achieve a desired polarization, e.g., circular, linear, or elliptical. The number of antenna elements 125, their type, sizes, shapes, inter-element spacing, and the manner in which they are fed may be varied by design to achieve targeted performance metrics. In a typical embodiment antenna 100 may include hundreds or thousands of antenna elements 125. In embodiments described below, each antenna element 125 is a microstrip patch fed with a probe feed. The probe feed may be implemented as a via that electrically connects to an input/output (I/O) pad of an RFIC chip 126. An I/O pad is an interface that allows signals to come into or out of the RFIC chip 126. In other examples, an electromagnetic feed mechanism is used instead of a via, where each antenna element 125 is excited from a respective feed point with near field energy.

Antenna 100 may be configured for operation over a millimeter (mm) wave frequency band, generally defined as a band within the 30 GHz to 300 GHz range. In other examples, antenna 100 operates in a microwave range from about 1 GHz to 30 GHz, or in a sub-microwave range below 1 GHz. Herein, a radio frequency (RF) signal denotes a signal with a frequency anywhere from below 1 GHz up to 300 GHz. It is noted that an RFIC chip configured to operate at microwave or millimeter wave frequencies is often referred to as a monolithic microwave integrated circuit (MMIC). A MMIC is typically composed of III-V semiconductor materials or other materials such as silicon-germanium (SiGe).

Each RFIC chip 126 may include active beamforming circuitry, e.g., an amplifier and/or a phase shifter used to adjust one or more signals communicated with a connected antenna element(s) 125. In embodiments where RFIC chips 126 include dynamically controlled phase shifters, antenna 100 is operable as a phased array for transmit and/or receive operations. In a phased array embodiment, a beam formed by antenna 100 is steered to a desired beam pointing angle set primarily according to the phase shifts of the phase shifters. Additional amplitude adjustment within RFIC chips 126 may also be included to adjust the beam pattern. With RF front end amplifiers and/or phase shifters distributed across the effective aperture of the antenna array, antenna 100 may be referred to as an active antenna array. In some embodiments, antenna 100 operates as both a transmitting and receiving antenna system, and each RFIC chip 126 includes receive circuitry comprising at least one low noise amplifier (LNA) for amplifying a receive signal, and at least one power amplifier (PA) for amplifying a transmit signal. In this case, each RFIC chip 126 may include suitable transmit/receive (T/R) switching/filtering circuitry to enable bidirectional signal flow on shared resources. Antenna 100 is alternatively configured to operate only as a receive antenna system or only as a transmit antenna system, in which case each RFIC chip 126 may include an LNA but not a PA, or vice versa.

Figure 2:
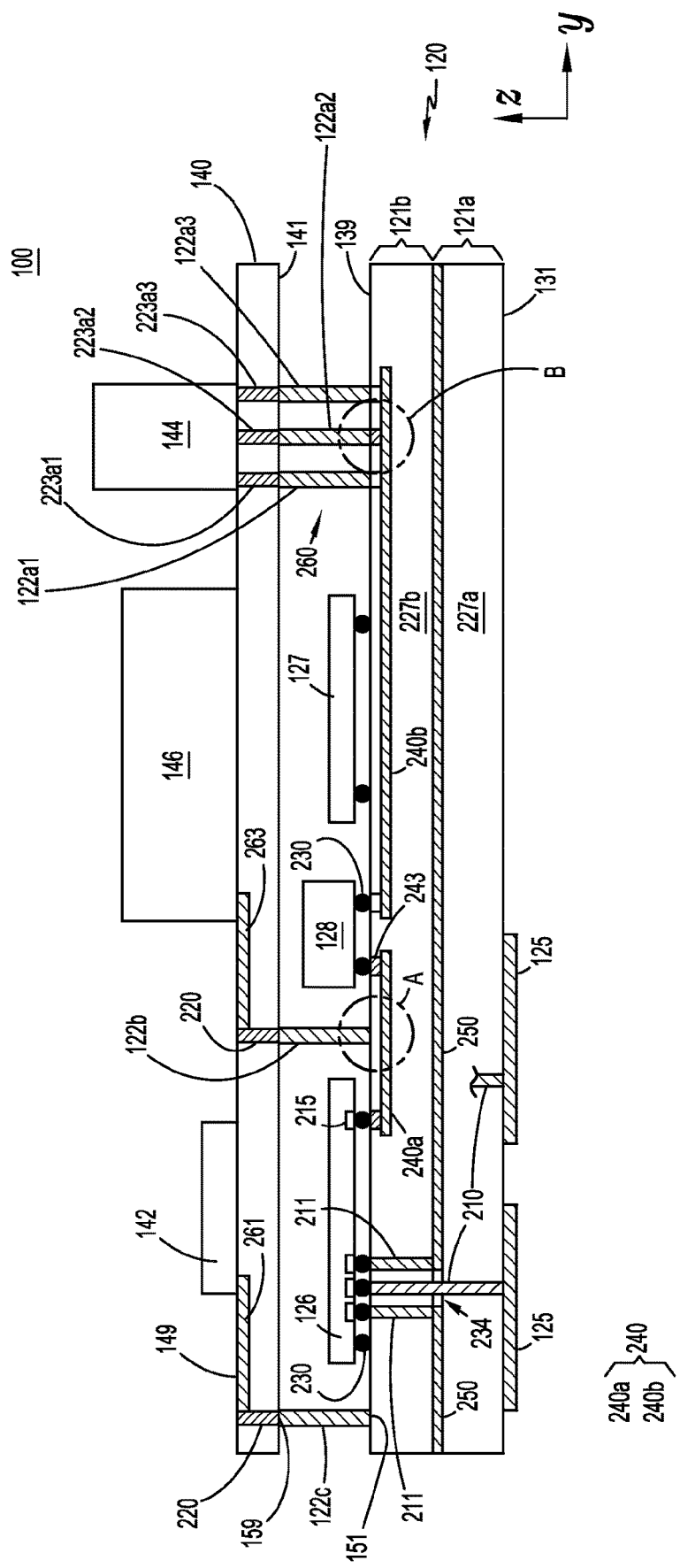
FIG. 2 is an example cross-sectional view of a portion of the antenna apparatus of FIG. 1 according to an embodiment.

FIG. 2 is a cross-sectional view of a portion of antenna 100 of FIG. 1 in an assembled state, according to an embodiment. The cross-sectional view represents a non-linear section of antenna 100 shown in FIG. 1, with some distal features of the view omitted for clarity. In this example, antenna substrate 120 is configured in a "dual RF layer" configuration comprised of a first layer 121a and a second layer 121b. Top layers of antenna substrate 120 at second surface 139 such as those in region "A" (described later but not shown in FIG. 2) may include one or more thin metal layers for DC and/or control signal routing.

Layer 121a may include a first dielectric layer 227a, and a metal layer 250 serving as an antenna ground plane for reflecting signal energy transmitted/received by antenna elements 125. Antenna elements 125 forming a planar array are disposed at first surface 131 of antenna substrate 120 (the lower surface of dielectric layer 227a). Each antenna element 125 may be coupled to a respective RFIC chip 126 through a first via 210 serving as a signal conductor of a probe feed. First via 210 traverses an opening 234 within ground plane 250. Second vias 211 on opposite sides of first via 210 serve as ground conductors for the probe feed and make electrical connections between respective ground contacts of RFIC chip 126 and ground plane 250. Second layer 121b includes a second dielectric layer 227b and another metal layer 240 which is patterned to form RF transmission line conductors between various connection points. Dielectric layers 227a, 227b may be composed of any suitable dielectric such as fused silica. Connections between metal layer 240 and connection points (e.g., I/O pads) on RFIC chips 126, PCB sections 128, IC chips 127 and any column 122 making an RF connection, may each be made through a respective short via 243 and an electrical connection joint 230 such as a solder ball or copper pillar. For example, a first portion 240a of second metal layer 240 is a transmission line conductor coupling an I/O pad 215 of RFIC chip 126 to a connection point of a PCB section 128. A second portion 240b is a transmission line conductor coupling another connection point of PCB section 128 to a connection point of a "signal column" 122a2 discussed below.

Columns 122 may each have a height greater than the thickness of any one of the components 126-128 attached to antenna substrate 120. Thus, an air gap may exist between the top surfaces of components 128 and PCB 140. As discussed above, one way of forming each column 122 is by building up liquified metal such as solder one layer at a time, sequentially from column to column. Each column may be aligned with a respective connection pad on second surface 139 of antenna substrate 120. An alternative process may use pre-formed conductive columns and conductively adhere the bottom and top surfaces of the pre-formed columns to connection pads at surfaces 139 and 141, respectively, using a robotic tool or the like. Some examples of pre-formed columns 122 include solid cylinders, solid cylinders with a copper wrapped skin ("copper wrapped columns"), springs, and micro-coaxial cables. As mentioned, the structure and material of columns 122 may be sufficient to permit stress relief by accommodating CTE mismatch between antenna substrate 120 and PCB 140. As PCB 140 and antenna substrate 120 expand at different rates over temperature, the column 122 configuration may prevent breakage by flexing, compressing or stretching, while maintaining the mechanical and electrical connections. Copper wrapped columns, for example, may still maintain an electrical connection even when cracked.

Vias 220 formed within PCB 140 may couple conductive lines at top surface 149 to top ends 159 of respective columns 122. For instance, a via 220 electrically couples column 122c to a connection point of FPGA 142 through a conductive line 261 at top surface 149. In other examples, a via 220 may connect directly to the connection point of FPGA 142 if the layout permits. Bottom end 151 of column 122c is coupled to an I/O pad of RFIC chip 126 through a conductive line within dielectric layer 120b (e.g., a portion of layer 266 of FIG. 3A discussed later) and an electrically conductive joint 230. If column 122c is designated for routing a control signal, a ground connection path for the control signal to a ground connection point of RFIC chip 126 at its lower surface may similarly be comprised of: another via 220 coupled to a ground connection point of FPGA 142 (directly below it or through another conductive line at surface 149); another column 122; another conductor within dielectric layer 120b; and another conductive joint 230.

Similarly, DC connector 146 may provide a positive or negative voltage to RFIC chip 126 from an electrical contact at a lower surface of DC connector 146, through a path including a signal conductor 263 at surface 149, a via 220, column 122b, a first metal layer within dielectric layer 227b, and a conductive joint 230 connected to an I/O pad of RFIC chip 126. A similar path through another column 122 and a second metal layer within dielectric layer 227b may provide a ground connection for the DC voltage between ground contacts of DC connector 146 and RFIC chip 126.

RF connector 144 may be a coaxial or other type of connector electrically coupled to an RF input and/or output port of the BFN within PCB section 128. For example, a ground-signal-ground (GSG) transition ("GSG interconnect") 260 may be used in the coupling path and may include signal column 122a2, a first "ground column" 122a1 on one side of signal column 122a2, and a second ground column 122a3 on the opposite side of signal column 122a2. These columns may connect at their upper ends to a first ground via 223a1, a signal via 223a2, and a second ground via 223a3, respectively, formed through PCB 140. RF connector 144 may include an inner conductor which is connected to signal via 223a2, and an outer conductor connected on one side to first ground via 223a1 and on an opposite side to signal via 223a3. Note that other connection structures such as a "GS" scheme utilizing just one ground column, or a scheme with three or more ground columns, may be substituted in other embodiments.

Signal column 122a3 may be coupled to the RF input and/or output point of the BFN within PCB section 128 through a redistribution layer (RDL) interconnect within antenna substrate 120. This interconnect may comprise a connection path including a via 243 (seen in FIG. 4) connected to the lower end of signal column 122a3, one end of transmission line conductor 240b, another via 243 on the opposite end of conductor 240b, and a connection joint 230 connecting the latter to PCB section 128. Ground columns 122a1 and 122a2 may connect to a microstrip ground layer within dielectric layer 120b or CPW ground conductors formed in metal layer 240.

FIG. 3A illustrates an example interconnect structure of the region "A" in FIG. 2. In this example, an upper structure of antenna substrate 120 includes a first isolation layer 262 such as a polymer, e.g., Benzocyclobutene (BCB), the top surface of which forms the top surface 139 of antenna substrate 120. A first metal layer 266 ("first conductive trace layer") is directly below first isolation layer 262 and may be designated for forming ground conductors for DC and/or control signals, or for forming signal conductors for the DC/control signals. A second metal layer 270 ("second conductive trace layer") is beneath first ground layer 266 and separated therefrom by a second isolation layer 268. If first metal layer 266 is designated for ground conductors for the DC/control signals, second metal layer may be designated for forming the signal conductors for these signals, and vice versa. Metal layer 240a used for transmission line conductors is situated between an upper portion of dielectric layer 227b (directly beneath second metal layer 270) and a lower portion of dielectric layer 227b.

In the example of FIG. 3A, column 122b is electrically connected to first layer 266 through an opening in isolation layer 262 slightly larger than the diameter of column 122b. To facilitate formation of an electrical connection joint, a surface finish metal layer 265 such as Electroless Palladium Immersion Gold (ENEPIG) or a nickel/gold alloy may have been formed within the opening in isolation layer 262. Layer 265 may have been deposited to have a base portion atop metal layer 266, a peripheral wall portion around the periphery of the opening, and an annular ring region atop surface 139, to form a cavity. A well of solder or other liquefiable metal 264 may fill the cavity, adhering to both the surface finish layer 265 and the lower end of column 122b to form the mechanical connection between column 122b and antenna substrate 120 and the electrical connection to metal layer 266 therein. In other embodiments, surface finish metal layer 265 is omitted.

Each of metal layers 266 and 270 and isolation layers 262 and 268 may be at least one order of magnitude thinner than the thickness of substrate 120. For instance, each of these layers may have a thickness on the order of 2-10 µm whereas substrate 120 may be on the order of 250 µm thick. Metal layers 266 and 268 may each form signal/ground lines in the x-y plane having a width on the order of 12 µm and spaced from one another by a spacing on the order of 12 µm. Each of layers 266 and 268 may have been etched or otherwise patterned to form hundreds or thousands of signal lines and ground lines in a typical embodiment of antenna 100.

Figure 3B:
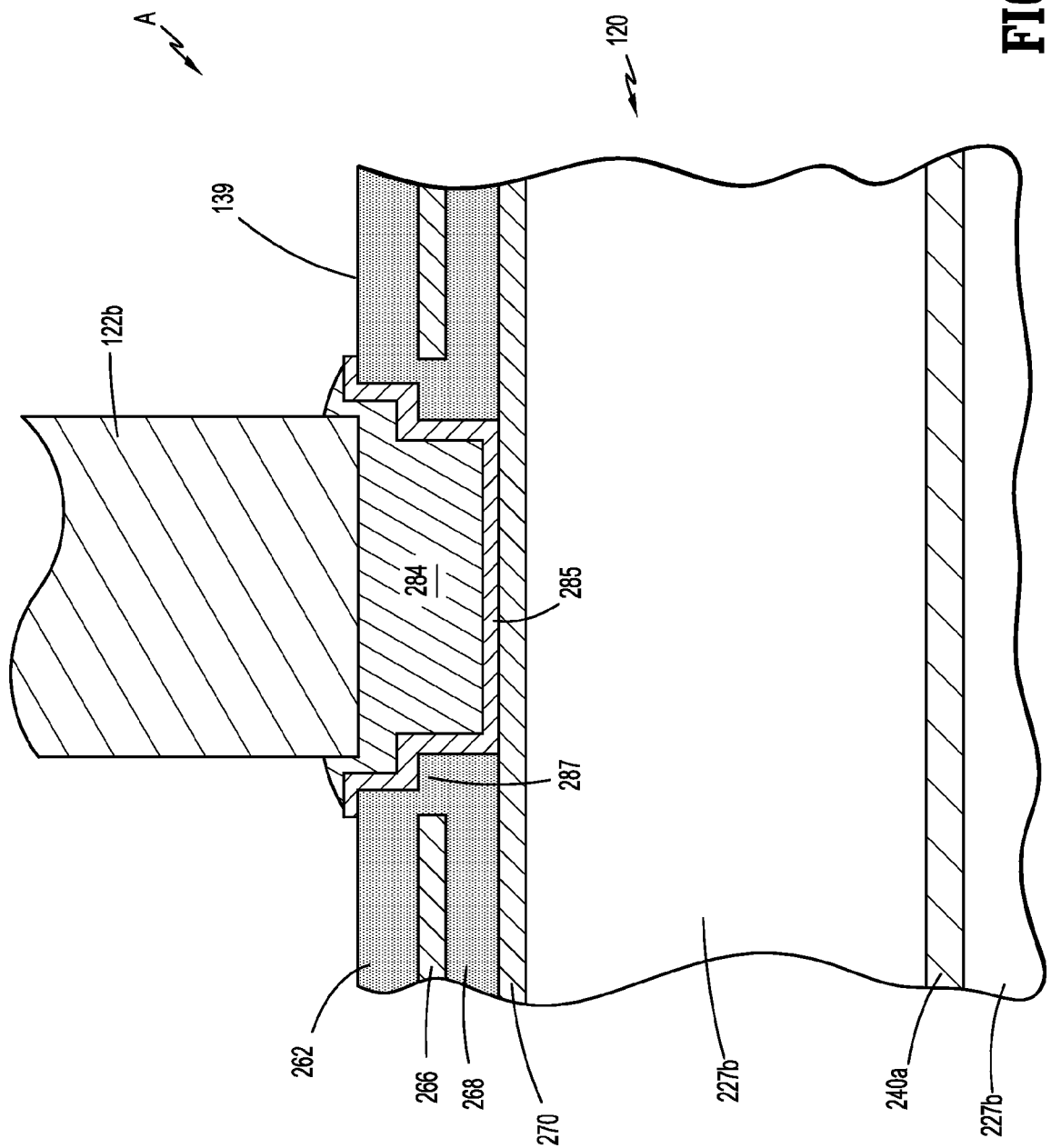
FIG. 3B illustrates another example interconnect structure of the region "A" in FIG. 2A, in which an electrically conductive column is conductively adhered to a second metal layer of the antenna substrate.

FIG. 3B illustrates another example interconnect structure of the region "A" in FIG. 2. In this example, column 122b is electrically connected to second metal layer 270 through openings in first isolation layer 262, first metal layer 266 and second isolation layer 268. The openings in these layers may have been formed by aligning resist material with different geometries layer by layer during deposition of the respective layers. To prevent column 122b from shorting to first metal layer 266, first metal layer 266 may have been formed by deposition patterning with a larger opening than those of first and second isolation layers 268 and 262. An annular isolation region 287 may have been formed at the depth of metal layer 266 to isolate first metal layer 266 from a subsequent electrical connection between column 122b and second metal layer 270. A surface finish layer 285 akin to surface finish layer 265 may have been formed using electroplating or the like. Surface finish layer 285 may have a base portion on second metal layer 270, annular wall portions against the edges of isolation layers 262, 266 and 268 in the respective openings, and a rim portion on upper surface 139. This results in a metal-lined cavity which can be filled with solder or other liquefiable metal 284. When the solder 284 cools while the lower end of column 122b is placed in the cavity, the solder 284 electrically connects column 122b to second layer 270 through surface finish layer 285. In other embodiments, surface finish layer 285 is omitted.

Figure 4:
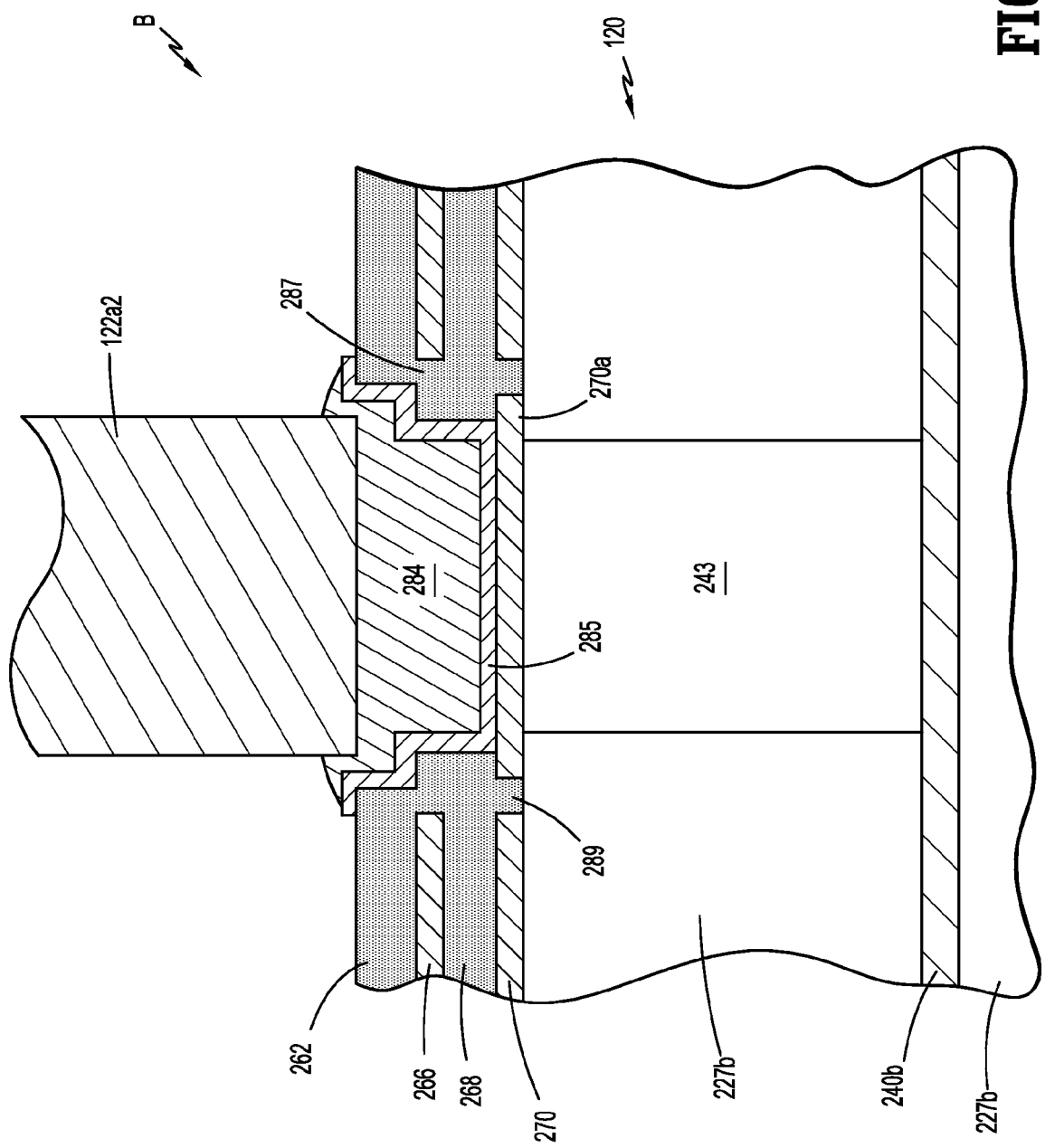
FIG. 4 depicts an example interconnect structure of the region "B" in FIG. 2, in which an electrically conductive column is conductively adhered to a transmission line layer of the antenna substrate.

FIG. 4 illustrates an example interconnect structure of the region "B" in FIG. 2, in which signal column 122a2 is conductively adhered to transmission line conductor 240b through via 243 within antenna substrate 120. Via 243 may connect on its upper end to a disc-shaped catch pad 270a formed within metal layer 270. For instance, metal layer 270 may have been formed atop dielectric layer 227b prior to forming via 243. When forming metal layer 270, catch pad 270a may have been formed by concentrically aligning a ring-shaped resist material with a circular region of via 243 (to be formed subsequently). Metal layer 270 may have then been deposited, resulting in a ring-shaped opening around catch pad 270a. Via 243 may have next been formed through catch pad 270a. Isolation material may have been deposited in a subsequent step to form an annular isolation region 289 within the openings around catch pad 270a, thereby isolating the remaining material of metal layer 270 from via 243. An interconnect structure between catch pad 270a and the lower end of column 122a2 may be the same as that described in connection with FIG. 3B for the connection to column 122b. That is, the interconnect structure may comprise surface metal layer 285 with a base portion atop catch pad 270a and annular wall portions and a rim portion, forming a cavity which is filled with liquifiable metal 284 as described above.

Transmission line conductor 240b may be e.g. a microstrip conductor, a coplanar waveguide (CPW) conductor, or a stripline conductor. If transmission line conductor 240b is configured as a CPW conductor, ground columns 122a1 and 122a3 may be conductively adhered to other respective portions of transmission line layer 240 on opposite sides of layer portion 240b in the same manner as described for FIG. 4. In the case of microstrip, the ground plane for the microstrip can be a region of the second metal layer 268 overlaying conductor 240b. In this case, ground columns 122a1 and 122a3 may each be conductively adhered to second metal layer 270 in the same fashion as described above for FIG. 3B. Alternatively, a region of first metal layer 266 may be used as the ground plane (by removing the corresponding region of second metal layer 270), in which case ground columns 122a1 and 122a3 may be conductively adhered to first metal layer 266 in the same fashion as was described for FIG. 3A. In the case of stripline, an additional metal layer would be provided beneath layer 240b and electrically connected to the ground plane provided by first or second metal layers 266, 270.

Figure 5A:
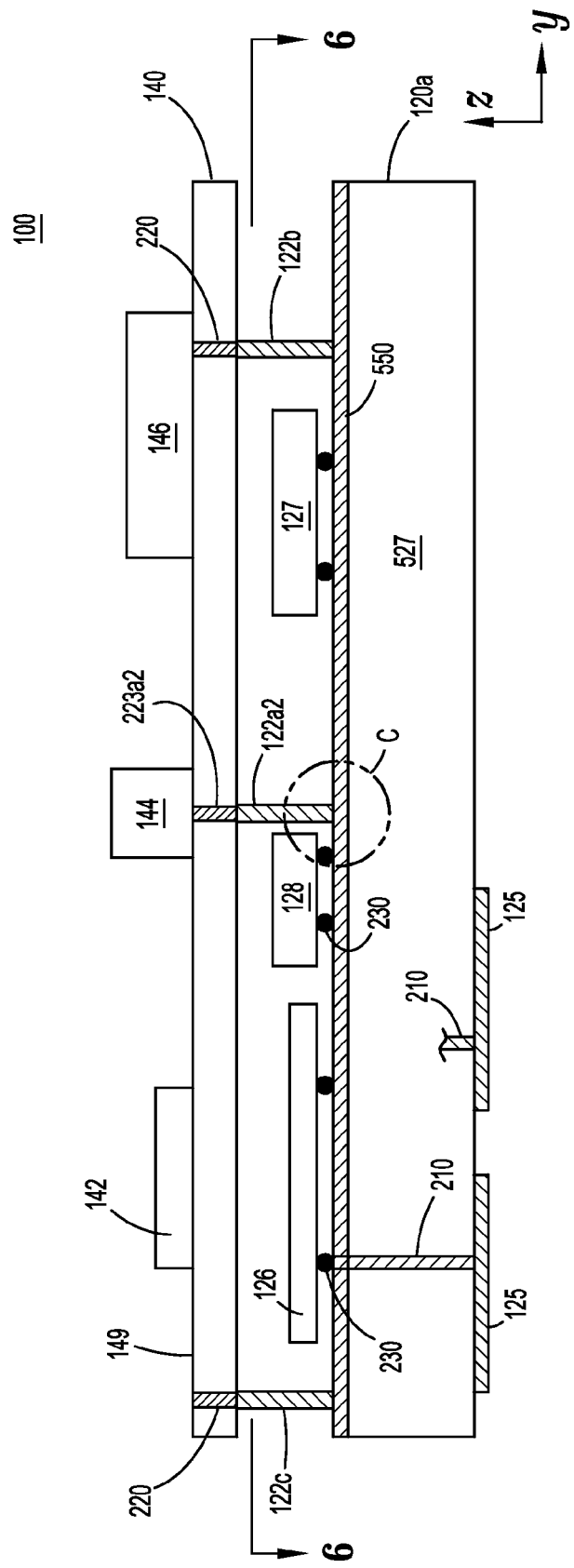
FIG. 5A is an example cross-sectional view of a portion of the antenna apparatus of FIG. 1 according to another embodiment.

FIG. 5A is an example cross-sectional view of a portion of the antenna apparatus of FIG. 1 according to another embodiment. (The view of FIG. 5A represents a different non-linear slice of antenna 100 than that of FIG. 2.) This embodiment employs a "single RF layer" antenna substrate 120a (another embodiment of antenna substrate 120 of FIG. 1) in which an antenna ground plane 550 is located within antenna substrate 120a proximate its top surface 139. Note that the cross-section of FIG. 5A shows signal column 122a2 electrically coupled between RF connector 144 and antenna substrate 120a through via 223a2. In this view, it may be assumed that first and second ground columns 122a1 and 122a3 are not visible since they are respectively behind, and in front of, signal column 122a2 (or vice versa).

Figure 5B:
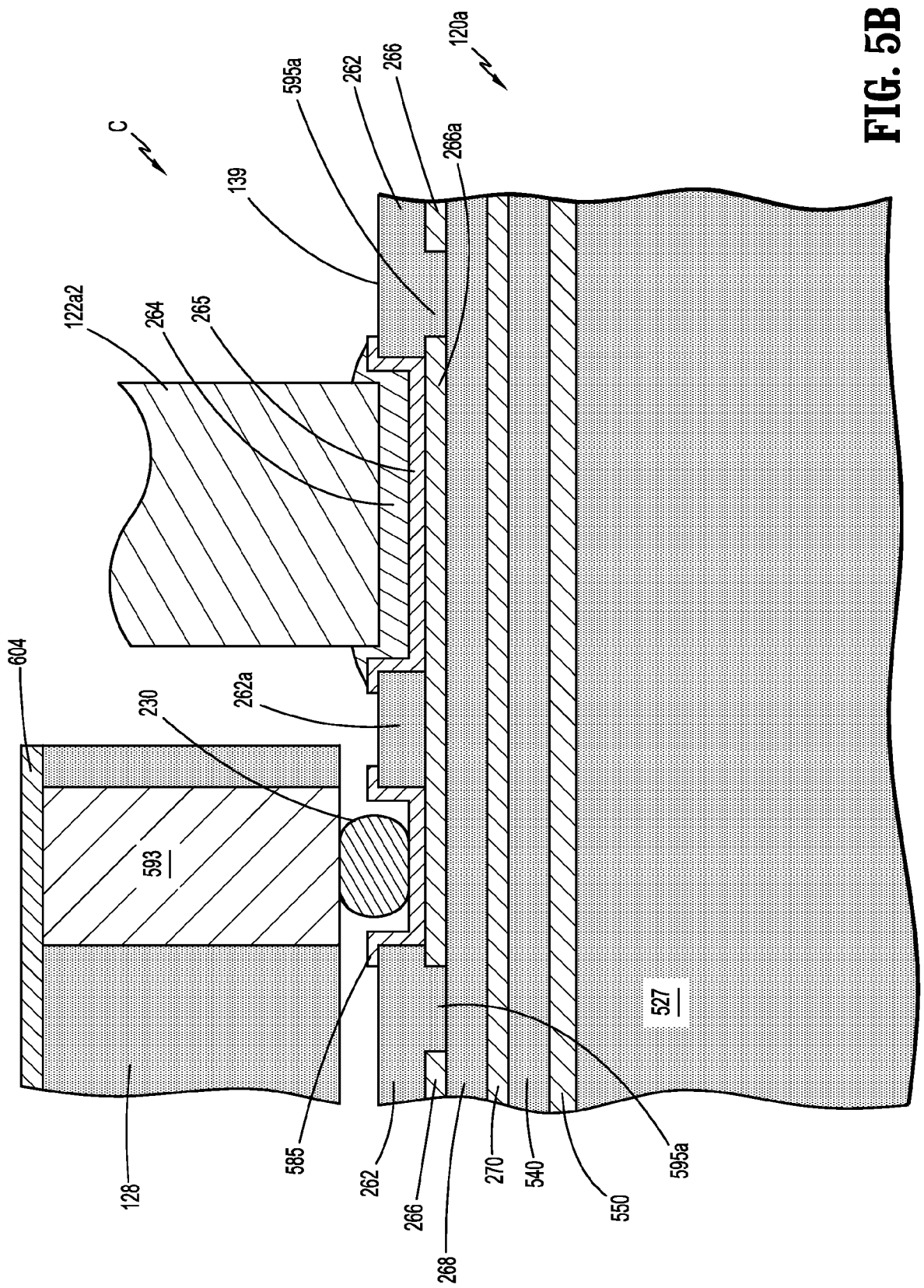
FIG. 5B is a cross-sectional view of an example structure of the region "C" in FIG. 5A.

FIG. 5B is a cross-sectional view of an example structure of the region C in FIG. 5A. Antenna substrate 120a may be composed of dielectric layer 527 and alternating metal/isolation layers at the upper portion of substrate 120a. These may include antenna ground plane 550 directly atop dielectric layer 527, which is sequentially followed towards top surface 139 by an isolation layer 540, second metal layer 270, isolation layer 268, first metal layer 266 and uppermost isolation layer 262.

Signal column 122a2 may conductively adhere to a first end of a conductive trace 266a formed in metal layer 266 through a solder well 264 and a surface finish metal layer 265, akin to those described above in connection with FIG. 3A. Conductive trace 266a may be isolated from adjacent portions of first metal layer 266 by a ring-shaped isolation region 595a surrounding conductive trace 266a. An electrical interconnect may be formed between a second, opposite end of conductive trace 266a and a CPW or microstrip signal conductor 604 at the top surface of PCB section 128. This interconnect may include a via 593 formed within PCB section 128, an electrical connection joint 230, and a surface finish metal layer 585 formed on the second end of conductive trace 266a. An isolation section 262a of isolation layer 262 may have been formed to support walls of surface finish metal layer 265. Alternatively, the section 265a is substituted with a conductive layer section, e.g., additional surface finish metal layer material.

If PCB section 128 is configured as a CPW transmission line, first and second ground conductors on opposite sides of signal conductor 604 may connect to lower ends of ground columns 122a1 and 122a3, respectively, using a similar configuration as that of FIG. 5B. In this case, the respective connections may be made through first and second additional conductive traces ("ground traces") formed in metal layer 266 on opposite sides of, and isolated from, conductive trace 266a. In other words, the first and second ground traces, in conjunction with conductive trace 266a, form an interconnecting section of CPW transmission line. Alternatively, the ground connections are made in a different metal layer within substrate 120a than the metal layer (e.g. 266) used for the signal conductor connection.

If PCB section 128 is configured as a microstrip transmission line, the signal line 604 to signal column 122b connection may be made the same way as in FIG. 5B, through a similar conductive trace 266a. In this case, a microstrip ground plane may be present at the lower surface of PCB section 128 and the lower end of via 593 may pass through an opening in the microstrip ground plane. Further, first and second ground traces may extend on opposite sides of conductive trace 266a and may each be connected on one end to a respective connection point of the microstrip ground plane, and on the opposite end to ground column 122a1 or 122a3, respectively.

It is noted here that a similar interconnect as that illustrated in FIG. 5B may be made between an I/O pad at a lower surface of an RFIC chip 126 and first metal layer 266. (The interconnect may comprise a conductive joint 230 within a cavity lined with a surface finish metal layer 585.) To connect any I/O pad of an RFIC chip 126 to a signal line of second metal layer 270, openings are formed within each of first metal layer 266 and second isolation layer 268. Peripheral surfaces of these openings may be lined with surface finish metal layer 585 extended to second metal layer 270 to form a cavity. The cavity may be filled with liquefiable metal to form a conductive well, akin to the conductive well 284 of FIG. 3B. The conductive well may connect to the lower end of the I/O pad of RFIC chip 126.

Antenna ground plane 550 may be electrically connected to a microstrip ground plane at the lower surface of RFIC chip 126 and/or PCB section 128. The interconnect for this connection may comprise at least one electrical connection joint 230 and a solder well or the like within antenna substrate 120a extending to antenna ground plane 550. Such a solder well may have an upper portion similar to solder well 284 of FIG. 3B described above and a lower portion extending through an isolated opening in second metal layer 270 and connecting to ground plane 550.

Figure 6:
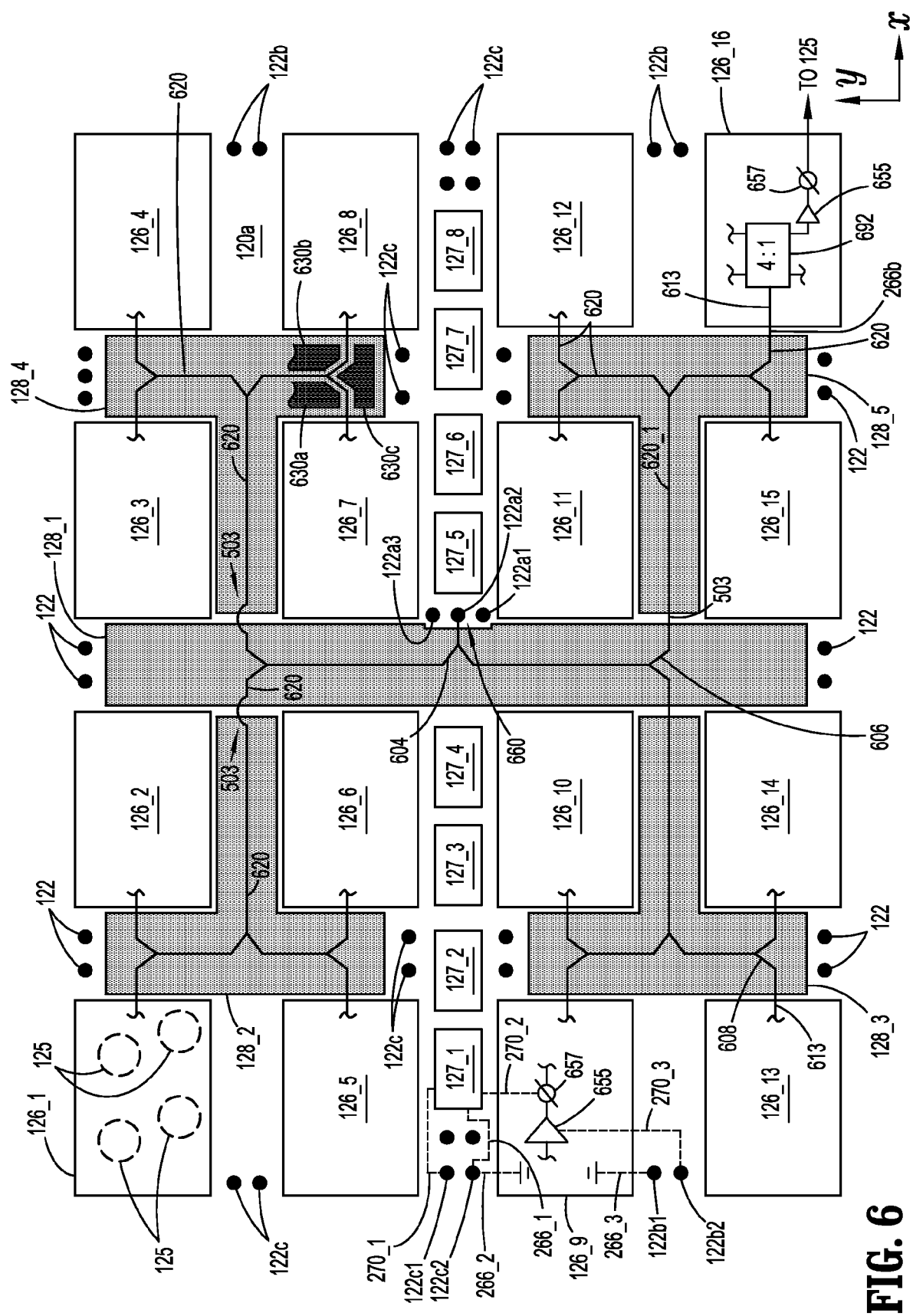
FIG. 6 is an example view taken along the line 6-6 of FIG. 5A, and illustrates a layout of IC chips and PCB sections attached to a surface of the antenna substrate.

FIG. 6 is an example view taken along the line 6-6 of FIG. 5A. This view illustrates an exemplary layout of IC chips and PCB sections looking down towards top surface 139 of antenna substrate 120a. Electrically conductive columns 122 (including columns 122a, 122b, 122c, etc.) may be distributed in both peripheral and inner regions of the layout. An example is presented illustrating 16 RFIC chips 126_1 to 126_16 arranged uniformly in rows and columns; eight serial peripheral interface (SPI) chips 127_a to 127_8 linearly arranged between a pair of adjacent rows of the RFIC chips 126; and five PCB sections 128_a to 128_5 within which at least a portion of the BFN is formed. PCB sections 128 include signal conductors 620 of the BFN at its top surface, which may be electrically connected to respective signal conductors 613 within RFIC chips 126 through RDL interconnects 266b formed in first metal layer 266, or interconnects formed in second metal layer 270. (RDL interconnects 266b may be assumed visible in the view of FIG. 6 through first isolation layer 262.) If PCB sections 128 are implemented as CPW, CPW ground conductors such as 630a, 630b, 630c are present on opposite sides of signal conductors 620. These ground conductors 630a-630c may each be electrically connected through RDL interconnects to CPW ground conductors (not shown) of RFIC chips 126 on opposite sides of signal conductors 613. In the case of microstrip, a microstrip ground plane may be present at the lower surfaces of PCB sections 128 and RFIC chips 126, which are suitably connected together. It is noted here that a similar layout as shown in FIG. 6 may be implemented for the embodiment of FIG. 2; however, in this case the electrical connections between signal conductors 613 and 620 may be made through a transmission line layer (metal layer 240) within antenna substrate 120.

The BFN within PCB sections 128 may, in the transmit direction of antenna 100, receive an input RF signal from RF connector 144 through a GSG transition 660 formed by signal column 122a2, ground column 122a1 and ground column 122a3. The BFN may include a 2:1 I/O coupler 604 having an I/O port electrically connected to GSG transition 660 through an RDL connection within antenna substrate 120a or 120 (e.g. through conductive traces within first and/or second metal layers 266, 270 as described earlier). I/O coupler 604, in conjunction with other couplers of the BFN such as 606 and 608 may divide the input RF signal into sixteen divided transmit signals which are provided to RFIC chips 126_1 to 126_16, respectively. In the receive direction, RF receive signals output from RFIC chips 126_1 to 126_16 may be combined by the BFN and the combined receive signal is output to RF connector 144 through GSG transition 660. Some examples of the BFN couplers 604, 606, etc. include Wilkinson dividers (e.g., with printed resistors between divided output lines); hybrid ring ("rat race") couplers; and 90° branch line couplers. In other layout examples, to form a 1:K divider/combiner within transmission line sections 128, where K is other than 16, a larger or smaller number of 2:1 couplers and/or M:1 couplers (where M>2) are provided.

Each RFIC chip 126 may include active RF front end components such as at least one amplifier 655 and at least one phase shifter 657. Antenna elements 125 coupled to an RFIC chip 126 may approximately overlay the RFIC chip 126. For example, RFIC chip 126_1 is shown overlaying four antenna elements 125; each of these antenna elements may be connected to a respective signal path including one amplifier 655 and one phase shifter 657, which individually control amplitude and phase of signals traversing that antenna element 125. (For clarity of illustration, one amplifier 655 and one phase shifter 657 are shown just in RFIC chips 126_9 and 126_16. If, for example, four antenna elements 125 are coupled to each RFIC chip 126, each RFIC chip 126 may include four amplifiers 655 and four phase shifters 657.)

DC voltages and control voltages originating from DC connector 146 and FGPA 142 may be routed through columns 122 to RFIC chips 126 and SPI chips 127 via conductors formed in metal layers 266 and 270. DC voltages may bias amplifiers 655 and/or be used by other circuitry within RFIC chips 126 and SPI chips 127. For instance, a DC biasing voltage from DC connector 146 may be carried on column 122b2 and routed to amplifier 655 within RFIC chip 126_9 through conductive line 270_3 and an I/O contact pad at the lower surface of RFIC chip 126_9. A ground return for the DC biasing voltage back to DC connector 146 may include a conductive line 266_3 and column 122b1.

In a similar fashion, control signals may be routed from FGPA 142 to SPI chips 127 and/or RFIC chips 126 through columns 122c. For instance, phase/amplitude control signals for beam steering may be generated by FGPA 142 and routed to SPI chips 127. As an example, a control signal generated by FGPA 142 may be applied across columns 122c1 and 122c2. The control signal may be routed to SPI chip 127_1 across conductive lines 270_1 and 266_1, connected to columns 122c1 and 122c2, respectively. Based on the control signal, SPI chip 127_1 may generate a phase shifter control voltage and apply the same to phase shifter 657 through conductive line 270_2 to dynamically set a phase shift for signals traversing an antenna element 125 coupled to that phase shifter 657. In an example, column 122c2 may provide a ground return path for various control signals via electrical connection to each of: a ground contact of FGPA 142; a ground contact of SPI chip 127_1 (through conductive line 266_1); and a ground contact of RFIC chip 126_9 (through conductive line 266_2).

It is noted here that the BFN may be formed partially on PCB sections 128 and partially on RFIC chips 126. The BFN may be considered the signal paths and the divider/combiner circuitry between GSG transition 660 and the feed points of the amplifier elements 125. Thus, for example, if each RFIC chip 126 feeds N>1 antenna elements 125 as illustrated, there may be a N:1 combiner/divider 692 (N=4 in the example of FIG. 6) within each RFIC chip 126. The N:1 combiner/divider 692 may be situated between an input point 613 of the RFIC 126 and N inputs of N respective amplifiers 655 and/or phase shifters 657 each coupled to a respective antenna element 125. The N:1 combiner/divider 692 may be considered an "early stage(s)" of the BFN, whereas the BFN portion composed of couplers 608, 606, etc. may be considered "later stages" of the BFN.

In the example layout of FIG. 6, signal conductors 620 of adjacent PCB sections 128 may be connected to one another by wirebonds 503. For CPW transmission lines, a pair of ground conductors akin to 630*a* and 630*c* on opposite sides of signal conductors 620 may likewise be connected to corresponding ground conductors in adjacent PCB sections 128 via respective wirebonds 503. In an alternative embodiment, a common dielectric substrate is used for all of PCB sections 128_1 to 128_5 and wirebonds 503 are omitted.

In another embodiment, direct connections between adjacent PCB sections 128 are avoided by connecting BFN signal paths through RFIC chips 126 between different PCB sections 128.

Figure 7:
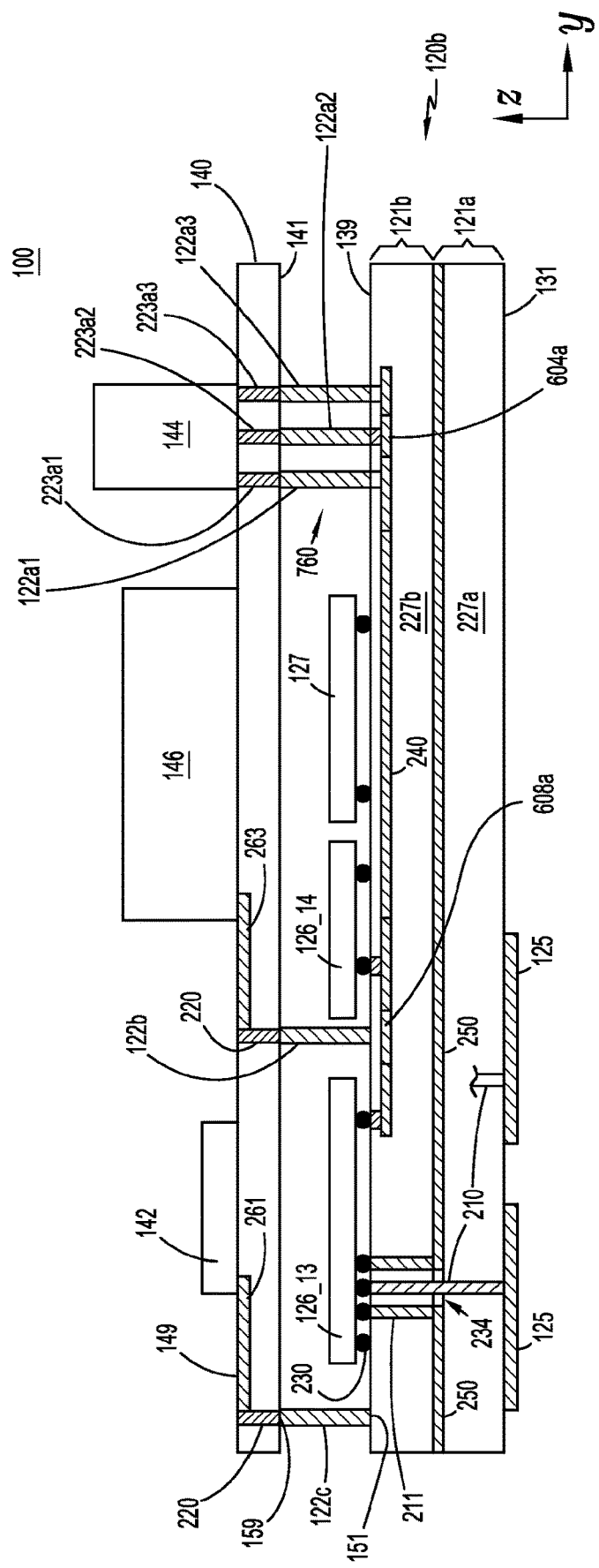
FIG. 7 is an example cross-sectional view of a portion of the antenna apparatus of FIG. 1 according to a further embodiment.

FIG. 7 is an example cross-sectional view of a portion of antenna 100 of FIG. 1 according to another embodiment. In this example, the beamforming network (BFN) is formed within an antenna substrate 120*b* rather than within PCB sections 128, and PCB sections 128 are omitted. This embodiment employs a dual RF layer structure for antenna substrate 120*b*, similar to that described above for the embodiment of FIG. 2. For example, RF connector 144 may be coupled to a CPW transmission line formed by metal layer 240 through a GSG transition 760 comprised of columns 122*a*1, 122*a*2 and 122*a*3. Alternatively, if metal layer 240 is used to form a microstrip signal conductor, ground columns 122*a*1 and 122*a*3 may be conductively adhered to another metal layer serving as a microstrip ground within antenna substrate 120*b*.

GSG transition 760 may be arranged at a location proximate to an I/O RF coupler 604*a* akin to I/O coupler 604 of FIG. 6. Metal layer 240 may be patterned to form a BFN with a layout similar to that of FIG. 6 in one example. In this case, one signal path of the BFN may lead to a 2:1 directional coupler 608*a* (akin to coupler 608), which splits an RF transmit signal into two divided signals that are applied to RFIC chips 126_13 and 126_14. Reciprocal signal flow from RFIC chips 226 through the directional couplers to GSG transition 760 may occur for a receiving antenna system. Other aspects of this configuration may be the same as those described in connection with FIG. 2.

Figure 8:
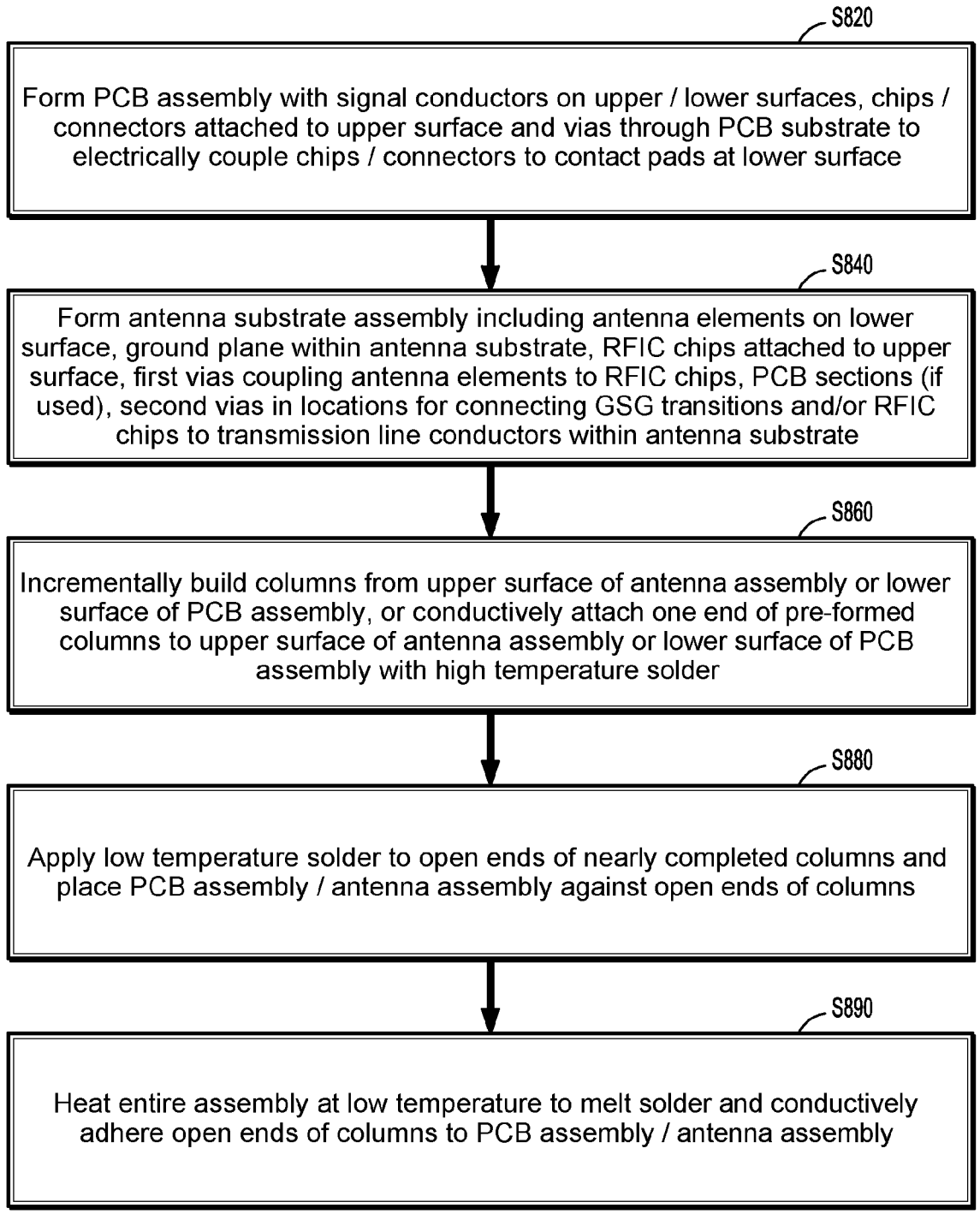
FIG. 8 is a flow chart illustrating an example method of fabricating an antenna apparatus according to an embodiment.

FIG. 8 is a flow chart describing an example method of fabricating antenna apparatus 100. A process step 820 may involve forming a PCB assembly 140 with signal conductors 261 on upper surface 149 and/or lower surface 141 (see e.g., FIG. 2); with chips/connectors (e.g., 142, 144, 146) attached to upper surface 149 and vias 220 through the PCB 140's substrate. The vias are formed to electrically couple the chips/connectors to contact pads at lower surface 141.

A separate process step S840 may involve forming an antenna substrate assembly including: antenna elements 125 on a lower surface 131 of an antenna substrate 120; a ground plane (e.g. 250, 550) within antenna substrate 120; first vias 210 for coupling antenna elements 125 to RFIC chips 126; second vias 243 in locations for connecting GSG transitions (formed by adjacent columns 122*a*1, 122*a*2, 122*a*3) and/or second vias 243 for connecting RFIC chips 126 to transmission line conductors within the antenna substrate; RFIC chips 126 and other chips 127 attached to the upper surface 139 of antenna substrate 120; and PCB sections 128 (if used) attached to upper surface 139.

Figure 9A:
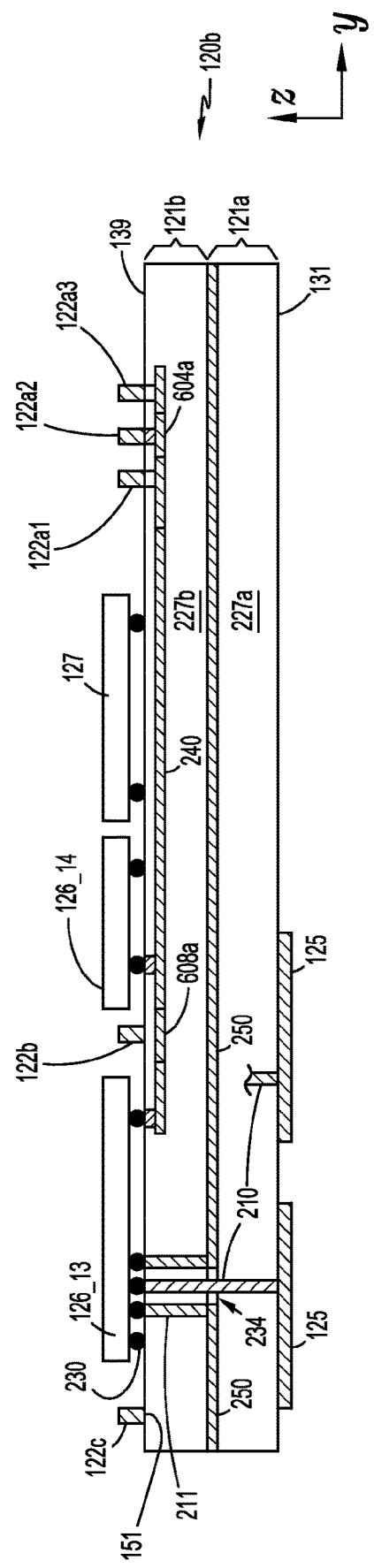
FIG. 9A illustrates an antenna substrate assembly of the antenna apparatus with electrically conductive columns partially formed thereon.
Figure 9B:
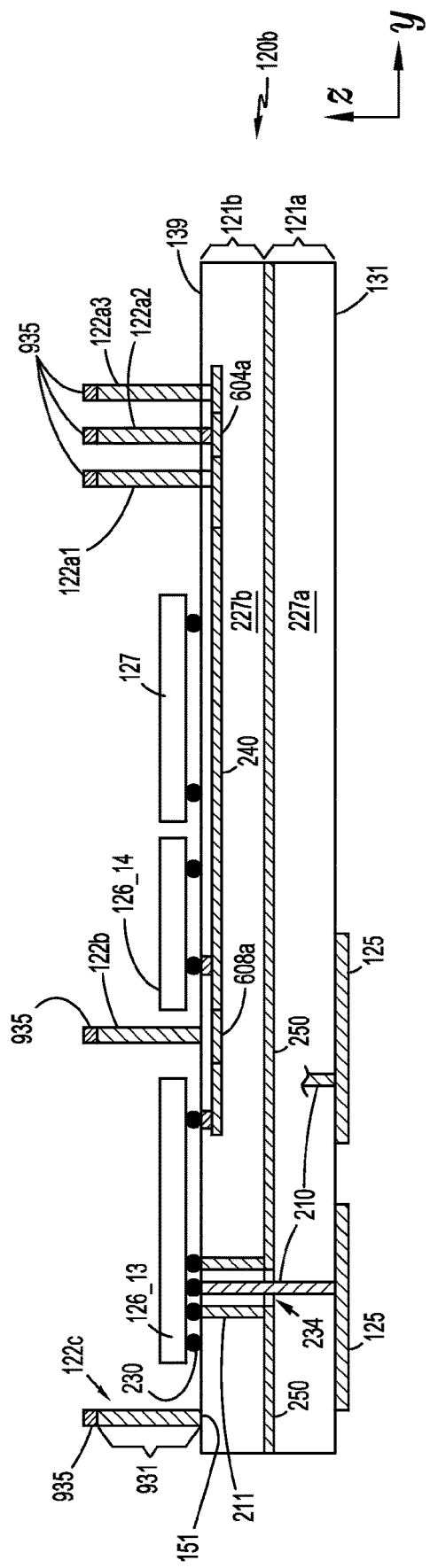
FIG. 9B illustrates the antenna substrate assembly with the columns fully formed thereon.

With the PCB assembly and antenna substrate assembly separately formed, columns 122 may be formed and attached at one end to either the upper surface of antenna assembly or the lower surface of the PCB assembly (S860). One example technique for this process involves incrementally building the columns from upper surface 139 of antenna substrate 120 or from the lower surface of the PCB assembly. One layer of each column 122 may be formed at a time using a computer controlled solder tool that moves in a sequence from column to column and deposits a small amount of solder to incrementally build up each column. FIG. 9A, for example, illustrates an interim assembly structure in which lower portions of columns 122*b*, 122*c*, etc. have been formed on upper surface 139 of antenna substrate 120. The process may be repeated layer by layer to incrementally build the height of the columns until a desired height is reached on all columns 122. A low temperature solder may be applied (S880) to the open ends of the nearly completed columns 122. For example, as shown in FIG. 9B, completed columns 122 may each have a majority portion 931 composed of high temperature solder and an end portion 935 composed of low temperature solder. Alternatively or additionally, a low temperature solder pad is formed at the lower surface of PCB 140 at locations aligned with columns 122.

Figure 9C:
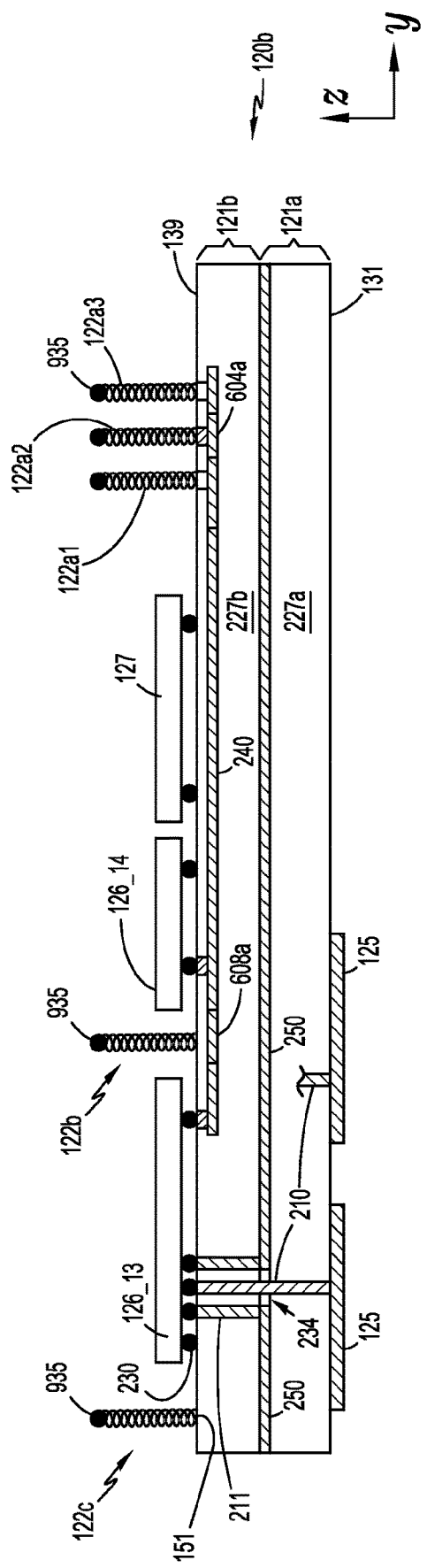
FIG. 9C shows the antenna substrate assembly with pre-formed columns attached thereto.

An alternative implementation for process S860 involves conductively adhering pre-formed columns 122 to antenna substrate 120 or PCB 140. For example, FIG. 9C shows the antenna substrate assembly with pre-formed columns 122 in the shape of springs attached thereto. Lower ends of the springs may be attached to surface 139 of antenna substrate 120 with high temperature solder. Low temperature solder 935 may be applied to the upper ends of the springs after the lower ends are attached. As mentioned earlier, pre-formed columns 122 may have other configurations such as a solid Pb/Sn alloy interior cylinder and a spiraling wrapped skin made of copper for better heat conduction and reliability. High and low temperature solder may be applied to opposite ends of these other column configurations in the same or similar way.

Note that process step S860 of forming/attaching the columns on the antenna substrate or PCB may be performed prior to the attachment of the IC chips/connectors on the antenna substrate or PCB of which the columns are initially attached.

With columns 122 thus conductively adhered at one end to the antenna assembly or the PCB assembly, and the PCB assembly or antenna assembly placed against the open ends of the columns 122, the entire assembly may then be heated (S890) at a low temperature sufficient to melt just the low temperature solder. When the low temperature solder cools, the previously open ends of columns 122 are conductively adhered to conductive contacts of the PCB or antenna assembly.

The above-described embodiments have been described in the context of antenna apparatus 100. Other implementations of the technology herein may be applied to non-antenna applications. For instance, in other electronic devices, antenna elements 125 are substituted with at least one other type of first circuit elements, such as IC chips. The RFIC chips 126 may be substituted with other types of second IC chips which are electrically coupled to the first IC chips through vias 210 extending through substrate 120. Electrically conductive columns 122 of the electronic device may connect in the same way to at least one upper metal layer within substrate 120 to provide DC interconnects, control signal interconnects and/or RF signal interconnects. The column interconnects may connect third IC chips/connectors/components attached to the upper surface of PCB 140 to the second IC chips attached to upper surface 139 of substrate 120. The resulting electronic device is formed in a compact three dimensional stacked structure. Further, if the substrate 120 and the PCB 140 of the electronic device have different coefficients of thermal expansion (CTEs), the same advantages of permitting stress relief between substrate 120 and PCB 140 as described above are applicable to the electronic device. That is, the structure and material of columns 122 may be sufficient to permit stress relief by accommodating CTE mismatch between substrate 120 and PCB 140. As PCB 140 and substrate 120 expand at different rates over temperature, the column 122 configuration may prevent breakage by flexing, compressing or stretching, while maintaining the mechanical and electrical connections.

Moreover, in the above-described embodiments, chip(s) 142 DC connector(s) 146 and/or RF connector(s) 144 are shown and described attached to an upper surface 149 of PCB substrate 140. In other embodiments, if space is available between antenna substrate 120 and PCB 140 and a flat, component-free surface is desirable at the upper surface 149, chips/connectors may be alternatively adhered to the lower surface of PCB 140. In this case, connectors such as 144, 146 may have side-facing connection ports. In these or other embodiments, no circuit elements or antenna elements may be provided at the lower surface 131 of substrate 120.

While the technology described herein has been particularly shown and described with reference to example embodiments thereof, it will be understood by those of ordinary skill in the art that various changes in form and details may be made therein without departing from the spirit and scope of the claimed subject matter as defined by the following claims and their equivalents.

What is claimed is:

1. An antenna apparatus comprising:
   an antenna substrate having opposite first and second surfaces;
   a plurality of antenna elements disposed at the first surface of the antenna substrate;
   a printed circuit board (PCB) having opposite first and second surfaces;
   a plurality of deformable electrically conductive columns, each comprising at least one of springs, micro-coaxial cables, and cylinders with copper spiral wrappings, and each having a first end attached to the second surface of the PCB and a second end attached to the second surface of the antenna substrate, to secure the PCB to the antenna substrate and to provide an electrical interconnects between the PCB and the antenna substrate;
   a plurality of radio frequency integrated circuit (RFIC) chips each attached to the second surface of the antenna substrate and coupled to the plurality of antenna elements; and
   at least one circuit element attached to the first surface of the PCB and electrically coupled to at least one of the RFIC chips through at least one of the electrically conductive columns.

2. The antenna apparatus of claim 1, wherein at least one of the electrical interconnects is a radio frequency (RF) interconnect to communicate an RF signal.

3. The antenna apparatus of claim 1, wherein at least one of the electrical interconnects is a direct current (DC) interconnect to communicate a DC signal.

4. The antenna apparatus of claim 1, wherein at least one of the electrical interconnects is a data control signal interconnect to communicate a data control signal.

5. The antenna apparatus of claim 4, wherein the data control signal is provided to multiple ones of the RFIC chips to adjust phase shifters therein to create a phased array.

6. The antenna apparatus of claim 1, wherein the PCB and the antenna substrate have different coefficients of thermal expansion (CTEs), and the columns are configured to deform by flexing, compressing or stretching to provide relief of stress due to the different CTEs.

7. The antenna apparatus of claim 1, wherein the at least one circuit element comprises an IC chip that provides control signals and/or bias voltages to the RFIC chips through the at least one of the columns and a conductive trace layer at the second surface of the antenna substrate.

8. The antenna apparatus of claim 7 wherein the IC chip is a field-programmable gate array (FPGA).

9. The antenna apparatus of claim 1, wherein the at least one circuit element comprises a DC connector that provides a DC voltage to the RFIC chips through the at least one of the columns and a conductive trace layer at the second surface of the antenna substrate.

10. The antenna apparatus of claim 1, wherein the at least one circuit element comprises an RF connector that routes an RF signal to or from the RFIC chips through the at least one of the columns.

11. The antenna apparatus of claim 10, wherein:
    the plurality of columns comprise a first column and second and third columns on opposite sides of the first column; and
    the RF connector is coupled to the RFIC chips through a ground-signal-ground interconnect comprising the first column serving as a signal interconnect and the second and third columns serving as respective ground interconnects.

12. The antenna apparatus of claim 1, wherein:
    the second surface of the antenna substrate comprises an antenna ground plane having openings for interconnects to electrically couple the RFICs and the antenna elements; and
    the RFIC chips have respective ground connection points electrically coupled to the antenna ground plane.

13. The antenna apparatus of claim 1, wherein each of the RFIC chips has a lower surface attached to the second surface of the antenna substrate through a plurality of electrical connection joints, and an upper surface separated from the second surface of the PCB by an air gap.

14. The antenna apparatus of claim 13, wherein the plurality of electrical connection joints are solder bumps or copper pillars.

15. The antenna apparatus of claim 1, wherein the plurality of electrically conductive columns comprise the springs.

16. The antenna apparatus of claim 1, wherein;
    the plurality of electrically conductive columns comprise the cylinders with copper spiral wrappings;
    the cylinders are solder columns; and
    the electrically conductive columns form a column grid array (CGA).

17. The antenna apparatus of claim 1, wherein the RFIC chips each comprise at least one of a receive amplifier, a transmit amplifier and a phase shifter.

18. The antenna apparatus of claim 1, wherein the RFIC chips are each coupled to one or more of the antenna elements through a respective via formed within the antenna substrate.

19. The antenna apparatus of claim 1, further comprising a beamforming network (BFN) formed on at least one dielectric substrate situated between the plurality of RFIC chips and attached to the second surface of the antenna substrate.

20. The antenna apparatus of claim 19, wherein the antenna substrate comprises:
   a first layer adjacent to the antenna elements;
   a second layer proximate to the RFICs; and
   an antenna ground plane between the first and second layers;
   wherein the second layer comprises a transmission line coupling the plurality of RFIC chips to the BFN.

21. The antenna apparatus of claim 20, wherein the antenna ground plane includes openings for first vias traversing therethrough, the first vias connecting the RFIC chips to the antenna elements; and
   the second layer includes a plurality of second vias that couple the antenna ground plane to the RFIC chips.

22. The antenna apparatus of claim 1, wherein the antenna substrate comprises a patterned metal layer that forms a beamforming network for the antenna apparatus.

23. The antenna apparatus of claim 1, further comprising a plurality of serial peripheral interface (SPI) chips attached to the second surface of the antenna substrate and coplanarly arranged with and coupled to the RFIC chips, the SPI chips being coupled to the at least one circuit element through at least one of the solder columns.

24. The antenna apparatus of claim 1, wherein the plurality of electrically conductive columns comprise the micro-coaxial cables.

* * * * *